US011222941B2

(12) United States Patent
Park et al.

(10) Patent No.: US 11,222,941 B2
(45) Date of Patent: Jan. 11, 2022

(54) DISPLAY DEVICE AND METHOD OF MANUFACTURING THE SAME FOR PROVIDING CONSISTENT DISPLAY QUALITY

(71) Applicant: Samsung Display Co., LTD., Yongin-si (KR)

(72) Inventors: Yong Sung Park, Seoul (KR); Wonjang Ki, Yongin-si (KR); Dae-Hyun Noh, Hwaseong-si (KR); Minsu Lee, Yongin-si (KR); Seung Bin Lee, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/746,289

(22) Filed: Jan. 17, 2020

(65) Prior Publication Data
US 2020/0258970 A1 Aug. 13, 2020

(30) Foreign Application Priority Data
Feb. 12, 2019 (KR) .......................... 10-2019-0015973

(51) Int. Cl.
H01L 29/08 (2006.01)
H01L 27/32 (2006.01)
G09G 3/3266 (2016.01)
G09G 3/3275 (2016.01)
H01L 51/56 (2006.01)

(52) U.S. Cl.
CPC ....... H01L 27/3276 (2013.01); G09G 3/3266 (2013.01); G09G 3/3275 (2013.01); H01L 27/3258 (2013.01); H01L 51/56 (2013.01); H01L 2227/323 (2013.01)

(58) Field of Classification Search
CPC .... H01L 29/08; H01L 27/3258; G09G 3/3266
See application file for complete search history.

(56) References Cited

U.S. PATENT DOCUMENTS

2017/0294502 A1* 10/2017 Ka ..................... H01L 27/3258
2018/0286307 A1* 10/2018 Kim .................... G09G 3/3266

FOREIGN PATENT DOCUMENTS

| KR | 10-2001-0003874 | 1/2001 |
| KR | 10-1640192 | 7/2016 |
| KR | 10-2017-0115150 | 10/2017 |
| KR | 10-2017-0127602 | 11/2017 |

* cited by examiner

Primary Examiner — Caleb E Henry
(74) Attorney, Agent, or Firm — Kile Park Reed & Houtteman PLLC

(57) ABSTRACT

A display device includes an active pattern disposed on a substrate, a first transistor, a first scan line, a first power voltage line, a first electrode pattern and an organic light-emitting layer disposed on the substrate. The first transistor includes a first gate electrode disposed in a first overlapping area of the active pattern where the first gate electrode overlaps the active pattern. The first scan line is disposed adjacent to the first gate electrode. The first power voltage line includes a first electrode portion and a second electrode portion. The first electrode portion overlaps the first gate electrode. The second electrode portion extends from the first electrode portion in a direction crossing the first scan line and overlaps the first scan line.

13 Claims, 13 Drawing Sheets

<COMPARATIVE EXAMPLE>

<COMPARATIVE EXAMPLE>

DISPLAY DEVICE AND METHOD OF MANUFACTURING THE SAME FOR PROVIDING CONSISTENT DISPLAY QUALITY

CROSS-REFERENCE TO RELATED APPLICATION

This application claims priority to and the benefit of Korean Patent Application No. 10-2019-0015973 under 35 U.S.C. § 119, filed on Feb. 12, 2019 in the Korean Intellectual Property Office, the disclosure of which is incorporated by reference herein in its entirety.

BACKGROUND

1. Field

Embodiments relate to a display device and a method for manufacturing the display device. More particularly, the embodiments relate to a display device capable of improving display quality and a method for manufacturing the display device.

2. Description of the Related Art

A flat display device is often in widespread use. An organic light-emitting display device is relatively thin and light, and has a low power consumption and a high response speed. In these and other respects, the organic light-emitting display device is continually developed to improve a display thereof.

The organic light-emitting display device may include thin film transistors and an organic light-emitting element connected to the thin film transistors. The organic light-emitting element may emit a light having an intensity corresponding to a voltage applied to the organic light-emitting element through the thin film transistors.

SUMMARY

Embodiments herein provide a display device for improving display quality, and a method of manufacturing the display device.

According to an embodiment, a display device may include an active pattern disposed on a substrate, a first transistor, a first scan line, a first power voltage line, a first electrode pattern and an organic light-emitting layer disposed on the substrate. The first transistor includes a first gate electrode disposed in a first overlapping area of the active pattern where the first gate electrode may overlap the active pattern. The first scan line may be disposed adjacent to the first gate electrode. The first power voltage line may include a first electrode portion and a second electrode portion. The first electrode portion may overlap the first gate electrode. The second electrode portion may extend from the first electrode portion in a direction crossing the first scan line and may overlap the first scan line.

The display device may further include a first insulation layer disposed on the active pattern, a second insulation layer disposed on the first gate electrode, a third insulation layer disposed on the first power voltage line and a fourth insulation layer disposed on the first electrode pattern. The first gate electrode may be disposed on the first insulation layer, the first power voltage line may be disposed on the second insulation layer, and the first electrode pattern may be disposed on the third insulation layer The display device may further include a second transistor and a third transistor. The second transistor may include a second gate electrode disposed in a second overlapping area of the active pattern where the first scan line may overlap the active pattern. The third transistor may include a third gate electrode disposed in a third overlapping area of the active pattern where the first scan line may overlap the active pattern. The first electrode pattern may be connected to a third drain electrode of the third transistor.

The display device may further include a data line crossing the first scan line, and a second power voltage line crossing the first power voltage line and that is connected to the first power voltage line.

The display device may further include a second scan line disposed parallel to the first scan line, a fourth transistor and a seventh transistor. The fourth transistor may include a fourth gate electrode disposed in a fourth overlapping area of the active pattern where the second scan line may overlap the active pattern. The seventh transistor may include a seventh gate electrode disposed in a seventh overlapping area of the active pattern where the second scan line may overlap the active pattern.

The display device may further include an initializing voltage line disposed parallel to the first scan line, and a second electrode pattern connecting the initializing voltage line to the seventh drain electrode of the seventh transistor.

The display device may further include a light-emitting line disposed parallel to the first scan line, a fifth transistor and a sixth transistor. The fifth transistor may include a fifth gate electrode disposed in a fifth overlapping area of the active pattern where the light-emitting line may overlap the active pattern. The sixth transistor may include a sixth gate electrode disposed in a sixth overlapping area of the active pattern where the light-emitting line may overlap the active pattern.

The display device may further include a third electrode pattern connected to a sixth drain electrode of the sixth transistor.

According to an embodiment, a display device may include a first transistor, a second transistor, a power voltage line, a first storage capacitor, a second storage capacitor, a third transistor and an organic light-emitting diode. The second transistor may be connected to a first scan line, a data line crossing the first scan line and a source electrode of the first transistor. The power voltage line may transfer a first power voltage. The first storage capacitor may be connected to the power voltage line and a gate electrode of the first transistor. The second storage capacitor may be connected to the power voltage line and the gate electrode of the first transistor. The third transistor may be connected to the first scan line, the gate electrode of the first transistor and a drain electrode of the first transistor. The organic light-emitting diode may receive a second power voltage and generate a light in response to operation of the first transistor.

The display device may further include a fifth transistor and a sixth transistor. The fifth transistor may be connected to a light-emitting line, the power voltage line and the source electrode of the first transistor. The sixth transistor may be connected to the light-emitting line, a drain electrode of the first transistor and the organic light-emitting diode.

The display device may further include a fourth transistor and a seventh transistor. The fourth transistor may be connected to a second scan line, the gate electrode of the first transistor and an initializing voltage line receiving an initializing voltage. The seventh transistor may be connected to the second scan line, the initializing voltage line and the organic light-emitting diode The first scan line may receive an n-th scan signal, wherein n is a natural number, and the second scan line receives an (n−1)-th scan signal.

The display device may further include a capacitor connected to the power voltage line and the gate electrode of the second transistor.

According to an embodiment, a method for manufacturing a display device is provided. According to the method, an active pattern may be formed on a substrate. A first transistor may be formed. The first transistor may include a first gate electrode disposed in a first overlapping area of the active pattern where the first gate electrode may overlap the active pattern. A first scan line may be formed to be adjacent to the first gate electrode. A first power voltage line may be formed. The first power voltage line may include a first electrode portion overlapping the first gate electrode and a second electrode portion, which may extend from the first electrode portion in a direction crossing the first scan line and may overlap the first scan line. A first electrode pattern may be formed. The first electrode pattern may be connected to the first gate electrode and may overlap the second electrode portion. An organic light-emitting layer may be formed on the substrate.

A first insulation layer may be formed on the active pattern. A second insulation layer may be formed on the first gate electrode. A third insulation layer may be formed on the first power voltage line. A fourth insulation layer may be formed on the first electrode pattern. The first gate electrode may be disposed on the first insulation layer, the first power voltage line may be disposed on the second insulation layer, and the first electrode pattern may be disposed on the third insulation layer.

A second transistor may be formed. The second transistor may include a second gate electrode in a second overlapping area of the active pattern where the first scan line may overlap the active pattern. A third transistor may be formed. The third transistor may include a third gate electrode in a third overlapping area of the active pattern where the first scan line may overlap the active pattern. The first electrode pattern may be connected to a third drain electrode of the third transistor.

A data line, which crosses the first scan line, may be formed. A second power voltage line, which crosses the first power voltage line and is connected to the first power voltage line, may be formed.

A second scan line may be formed to be parallel to the first scan line. A fourth transistor may be formed. The fourth transistor may include a fourth gate electrode disposed in a fourth overlapping area of the active pattern where the second scan line may overlap the active pattern. A seventh transistor may be formed. The seventh transistor may include a seventh gate electrode disposed in a seventh overlapping area of the active pattern where the second scan line may overlap the active pattern.

A light-emitting line may be formed to be parallel to the first scan line. A fifth transistor may be formed. The fifth transistor may include a fifth gate electrode disposed in a fifth overlapping area of the active pattern where the light-emitting line may overlap the active pattern. A sixth transistor may be formed. The sixth transistor may include a sixth gate electrode disposed in a sixth overlapping area of the active pattern where the light-emitting line may overlap the active pattern.

An initializing voltage line may be formed to be parallel to the first scan line. A second electrode pattern may be formed to connect the initializing voltage line to a seventh drain electrode of the seventh transistor. A third electrode pattern may be formed to be connected to a sixth drain electrode of the sixth transistor.

An electrode of a second conductive pattern, which receives a power voltage, may be disposed between a scan line, which may be a first conductive pattern, and a drain electrode of a third transistor, which may be a third conductive pattern. Thus, a parasitic capacitor therebetween the first and third conductive patterns is unnecessary, and a storage capacitance may be increased. Thus, a kickback voltage of the third transistor may be decreased, thereby preventing image defects such as a decrease in brightness and low brightness smudge.

BRIEF DESCRIPTION OF THE DRAWINGS

Aspects of one or more embodiments may be more clearly understood from the following detailed description when taken in conjunction with the accompanying drawings, in which.

DETAILED DESCRIPTION

Figure 1:
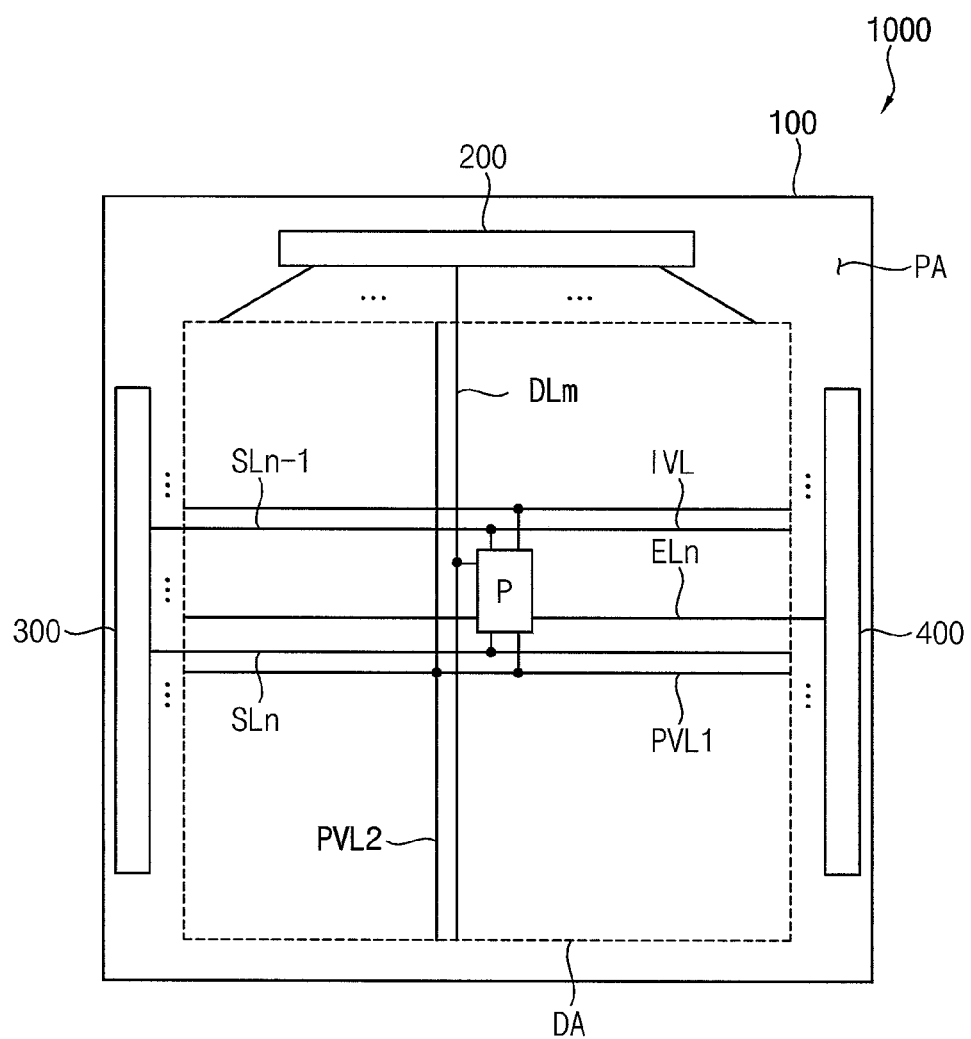
FIG. 1 is a plan view illustrating a display device according to an embodiment.
Figure 1:
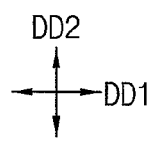

A display device and a method for manufacturing a display device according to embodiments of the disclosure will be described hereinafter with reference to the accompanying drawings, in which some embodiments are shown.

Although the disclosure may be modified in various manners and have additional embodiments, embodiments are illustrated in the accompanying drawings and will be mainly described in the specification. However, the scope of the disclosure is not limited to the embodiments in the accompanying drawings and the specification and should be construed as including all the changes, equivalents and substitutions included in the spirit and scope of the disclosure.

The drawings and description are to be regarded as only illustrative in nature, and thus are not limiting of embodiments described and claimed herein. Some of the parts which are not associated with the description may not be provided in order to describe embodiments of the disclosure and like reference numerals refer to like elements throughout the specification.

In the drawings, a size and thickness of each element are arbitrarily represented for better understanding and ease of description, however the disclosure is not limited thereto. In the drawings, the thickness of layers, panels, regions, and other elements may be exaggerated for clarity. In the drawings, for better understanding and ease of description, the thicknesses of some layers and areas may be exaggerated.

Further, in the specification, the phrase "in a plan view" means when an object portion is viewed from above, and the phrase "in a cross-sectional view" means when a cross-section taken by vertically cutting an object portion is viewed from the side. Additionally, the terms "overlap" or "overlapped" mean that a first object may be above or below a second object, and vice versa. The terms "face" and "facing" mean that a first object may directly or indirectly oppose a second object. In a case in which a third object intervenes between the first and second object, the first and second objects may be understood as being indirectly opposed to one another, although still facing each other. When a layer, region, substrate, or area, is referred to as being "on" another layer, region, substrate, or area, it may be directly on the other region, substrate, or area, or intervening regions, substrates, or areas, may be present therebetween. Conversely, when a layer, region, substrate, or area, is referred to as being "directly on" another layer, region, substrate, or area, intervening layers, regions, substrates, or areas, may be absent therebetween. Further when a layer, region, substrate, or area, is referred to as being "below" another layer, region, substrate, or area, it may be directly below the other layer, region, substrate, or area, or intervening layers, regions, substrates, or areas, may be present therebetween. Conversely, when a layer, region, substrate, or area, is referred to as being "directly below" another layer, region, substrate, or area, intervening layers, regions, substrates, or areas, may be absent therebetween. Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Throughout the specification, when an element is referred to as being "connected" to another element, the element may be "directly connected" to another element, or "electrically connected" to another element with one or more intervening elements interposed therebetween. It will be further understood that when the terms "comprises," "comprising," "includes" and/or "including" are used in this specification, they or it may specify the presence of stated features, integers, steps, operations, elements and/or components, but do not preclude the presence or addition of other features, integers, steps, operations, elements, components, and/or any combination thereof.

It will be understood that, although the terms "first," "second," "third," or the like may be used herein to describe various elements, these elements should not be limited by these terms. These terms are used to distinguish one element from another element or for the convenience of description and explanation thereof. For example, when "a first element" is discussed in the description, it may be termed "a second element" or "a third element," and "a second element" and "a third element" may be termed in a similar manner without departing from the teachings herein.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

FIG. 1 is a plan view illustrating a display device according to an embodiment.

Figure 2:
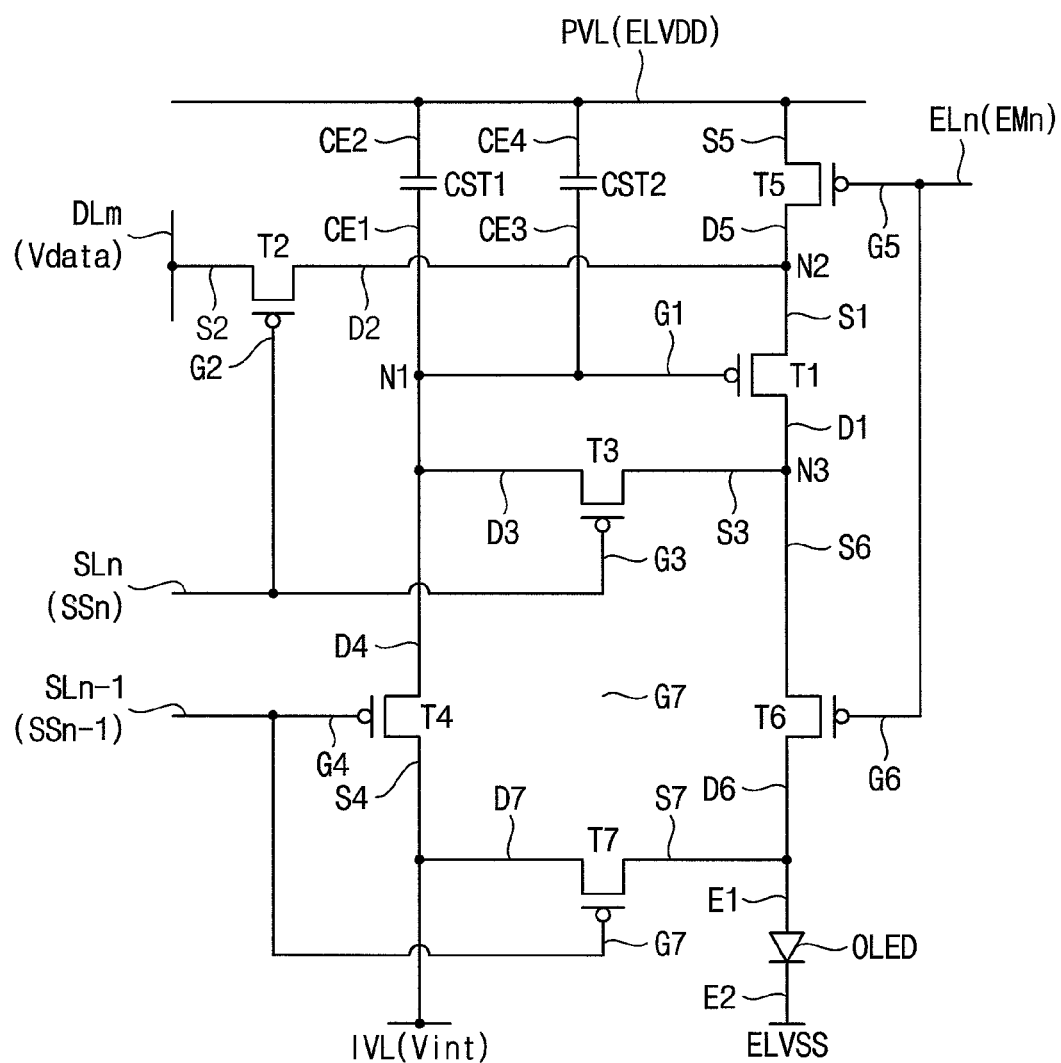
FIG. 2 is a schematic diagram of an equivalent circuit of a pixel of the display device of FIG. 1.
Figure 3:
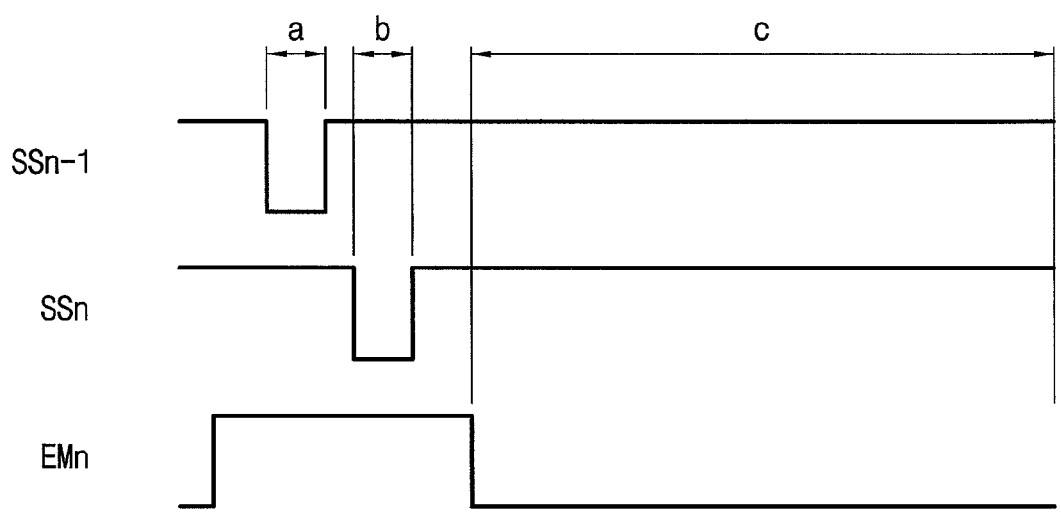
FIG. 3 is a waveform diagram illustrating a method for driving a pixel of the display device of FIG. 1.

FIG. 2 is a schematic diagram of an equivalent circuit of a pixel of the display device of FIG. 1. FIG. 3 is a waveform diagram illustrating a method for driving a pixel of the display device of FIG. 1.

Referring to FIG. 1, a display device 1000 may include a panel part 100, a main driver 200, a scan driver 300 and a light-emitting driver 400.

The panel part 100 may include a display part DA and a peripheral part PA including peripheral areas around or surrounding the display part DA.

The display part DA may include scan lines SLn−1 and SLn, data lines DLm, light-emitting lines ELn, first power voltage lines PVL1, second power voltage lines PVL2, initializing voltage lines IVL and pixels P, where n and m are natural numbers.

The scan lines SLn−1 and SLn may extend in a first direction DD1 and may be arranged in a second direction DD2 crossing the first direction DD1. The scan lines SLn−1 and SLn may be connected to the scan driver 300 disposed in the peripheral area PA. The scan lines SLn−1 and SLn may transfer scan signals provided from the scan driver 300 to the pixels P.

The data lines DLm may extend in the second direction DD2 and may be arranged in the first direction DD1. The data lines DLm may be connected to the main driver 200 disposed in the peripheral area PA. The data lines DLm may transfer data signals provided from the main driver 200 to the pixels P.

The light-emitting lines ELn may extend in the first direction DD1 and may be arranged in the second direction DD2. The light-emitting lines ELn may be connected to the light-emitting driver 400 disposed in the peripheral area PA. The light-emitting lines ELn may transfer light-emitting control signals provided from the light-emitting driver 400 to the pixels P.

The first power voltage lines PVL1 may extend in the first direction DD1 and may be arranged in the second direction DD2. The first power voltage lines PVL1 may be connected to the main driver 200. The first power voltage lines PVL1 may transfer a first light-emitting power voltage ELVDD provided from the main driver 200 to the pixels P.

The second power voltage lines PVL2 may extend in the second direction DD2 and may be arranged in the first direction DD1. The second power voltage lines PVL2 may be connected to the first power voltage lines PVL1 to transfer the first light-emitting power voltage ELVDD provided from the main driver 200 to the pixels P. The first power voltage lines PVL1 and the second power voltage lines PVL2 may be arranged in a mesh configuration.

The initializing voltage lines IVL may extend in the first direction DD1 and may be arranged in the second direction DD2. The initializing voltage lines IVL may be connected to the main driver 200. The initializing voltage lines IVL may transfer a initializing voltage Vint provided from the main driver 200 to the pixels P.

Each of the pixels P may include an organic light-emitting diode OLED and transistors for driving the organic light-emitting diode OLED.

For example, when referring to FIG. 2, the pixel P may include a pixel circuit PC.

The pixel circuit PC may include an organic light-emitting diode OLED, a first transistor T1, a first storage capacitor CST1, a second storage capacitor CST2, a second transistor T2, a third transistor T3, a fourth transistor T4, a fifth transistor T5, a sixth transistor T6 and a seventh transistor T7.

The organic light-emitting diode OLED may include a first diode electrode E1 and a second diode electrode E2. The first diode electrode E1 may be an anode, and the second diode electrode E2 may be a cathode. A second light-emitting power voltage ELVSS may be applied to the second diode electrode E2.

The first transistor T1 may include a first gate electrode G1 connected to a first node N1, a first source electrode S1 connected to a second node N2 and a first drain electrode D1 connected to a third node N3.

The first storage capacitor CST1 may include a first storage electrode CE1 connected to the first node N1 and a second storage electrode CE2 connected to a power voltage line PVL.

The second storage capacitor CST2 may include a third storage electrode CE3 connected to the first node N1 and a fourth storage electrode CE4 connected to the power voltage line PVL. The first and second storage capacitors CST1 and CST2 may be connected in parallel, thereby increasing a storage capacitance of the first transistor T1.

The second transistor T2 may include a second gate electrode G2 connected to an n-th scan line SLn, a second source electrode S2 connected to the data line DLm and a second drain electrode D2 connected to the second node N2.

The third transistor T3 may include a third gate electrode G3 connected to the n-th scan line SLn, a third source electrode S3 connected to a third node N3 and a third drain electrode connected to the first node N1. The third drain electrode D3 of the third transistor T3 is connected to the first and second storage capacitors CST1 and CST2. A kickback voltage Vkickback of the third transistor T3 may be defined by the following equation.

$$Vkickback = \frac{Cpara}{Cpara + CST1 + CST1} \times \Delta Vg \quad [\text{Equation 1}]$$

In Equation 1, Cpara is a parasitic capacitance of the third transistor T3, CST1 is a capacitance of the first storage capacitor, CST2 is a capacitance of the second storage capacitor, and $\Delta Vg$ is difference between a high voltage and a low voltage of a signal applied to the gate electrode of the third transistor T3.

According to Equation 1, when capacitances of the first and second storage capacitors CST1 and CST2 increase, the kickback voltage of the third transistor T3 may be reduced. When the kickback voltage of the third transistor T3 is reduced, variance of the kickback voltage due to a deterioration difference of the third transistor T3 may be reduced. Thus, defects such as a decrease in brightness and a low brightness smudge, due to deterioration of the third transistor T3, may be reduced or prevented.

The fourth transistor T4 may include a fourth gate electrode G4 connected to an (n−1)-th scan line SLn−1, a fourth source electrode S4 connected to the initializing voltage line IVL and a fourth drain electrode D4 connected to the first node N1.

The fifth transistor T5 may include a fifth gate electrode G5 connected to an n-th light-emitting line ELn, a fifth source electrode S5 connected to the power voltage line PVL and a fifth drain electrode D5 connected to the second node N2.

The sixth transistor T6 may include a sixth gate electrode G6 connected to the n-th light-emitting line ELn, a sixth source electrode S6 connected to the third node N3 and a sixth drain electrode D6 connected to the first diode electrode of the organic light-emitting diode OELD.

The seventh transistor T7 may include a seventh gate electrode G7 connected to the (n−1)-th scan line SLn−1, a seventh source electrode S7 connected to the first diode electrode of the organic light-emitting diode OELD and a seventh drain electrode D7 connected to the initializing voltage line IVL.

A method for driving the pixel circuit PC may be explained with reference to FIG. 3.

Referring to FIG. 3, during a first period 'a' of a frame, the fourth transistor T4 and the seventh transistor T7 may be turned on in response to a low voltage, which is a turn-on voltage of an (n−1)-th scan signal SSn−1 applied to the (n−1)-th scan line SLn−1, and the remaining transistors T1, T2, T3, T5 and T6 may be turned off. Thus, a previous data voltage charged at each of the first and second capacitors CTS1 and CTS2 may be initialized by the initializing voltage Vint applied to the initializing voltage line IVL. The anode that is the first diode electrode of the organic light-emitting diode OELD may be initialized by the initializing voltage Vint.

During a second period 'b' of the frame, the second transistor T2 and the third transistor T3 may be turned on in response to a low voltage of an n-th scan signal SSn applied to the n-th scan line SLn, and the remaining transistors T1, T4, T5, T6 and T7 may be turned off.

As the third transistor T3 is turned on, the first transistor T1 may be diode-connected. A voltage difference between a voltage Vdata applied to the second node N2, which corresponds to a data signal applied to the data line DLn, and a threshold voltage Vth of the first transistor T1 may be applied to the first node N1. Thus, a voltage having an absolute value of a difference between the voltage Vdata corresponding to the data voltage and the threshold voltage Vth may be applied to the first node N1. Thus, the threshold voltage of the first transistor T1 may be compensated.

Furthermore, the first and second capacitors CTS1 and CTS2 may be charged with a voltage corresponding to the data voltage Vdata.

As explained in the above, during the second period 'b' of the frame, the threshold voltage of the first transistor T1 may be compensated, and a voltage corresponding to the data voltage Vdata may be charged at the first and second capacitors CTS1 and CTS2.

During a third period 'c' of the frame, when an n-th light-emitting control signal EMn with a low voltage is applied to the n-th light-emitting line ELn, the fifth transistor T5 and the sixth transistor T6 may be turned on, and the remaining transistors T2, T3, T4 and T7 may be turned off.

Accordingly, the first transistor T1 may be turned on by the voltage corresponding to the data voltage Vdata, which has been stored in the first and second capacitors CST1 and CST2, and a driving current corresponding to the data voltage Vdata may flow through the organic light-emitting diode OLED. Thus, the organic light-emitting diode OLED may generate a light to display an image.

Figure 4:
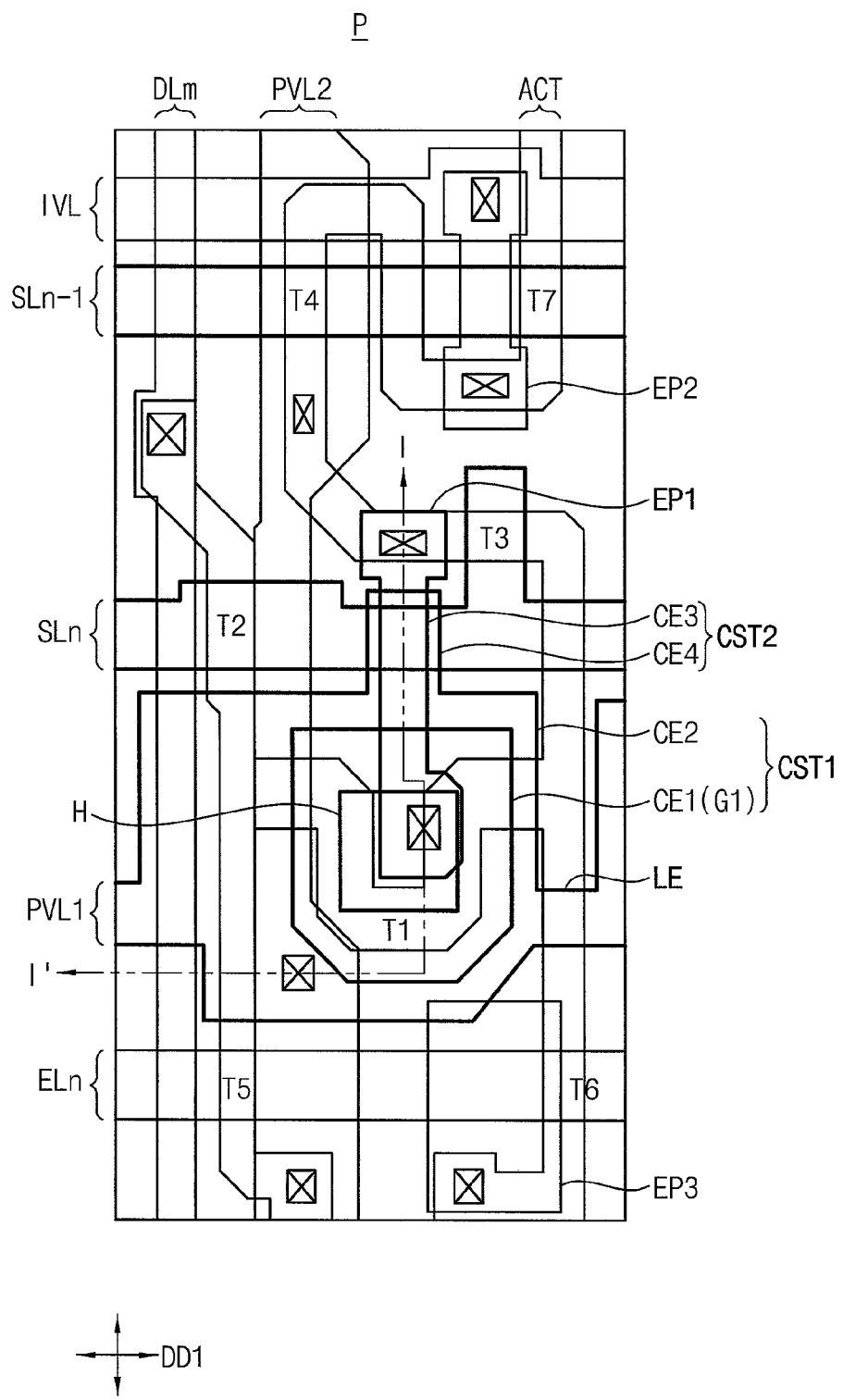
FIG. 4 is an enlarged plan view illustrating a pixel of the display device of FIG. 1.

FIG. 4 is an enlarged plan view illustrating a pixel of the display device of FIG. 1.

Referring to FIG. 4, the pixel P may include an active pattern ACT, a first gate electrode G1, an n-th scan line SLn, a first power voltage line PVL1, a first electrode pattern EP1, an (n−1)-th scan line SLn−1, an initializing voltage line IVL, a second electrode pattern E2, an n-th light-emitting line ELn, a third electrode pattern EP3, an m-th data line DLm and a second power voltage line PVL2.

The active pattern ACT may be formed as a single pattern in a pixel area of a substrate, where the pixel is defined.

The first gate electrode G1 may be disposed in a center portion of the pixel, and may have an island shape. The first transistor T1 may be defined in a first overlapping area of the active pattern, which overlaps the first gate electrode G1 so as to face the first gate electrode G1. As an example, the first overlapping area of the active pattern may indirectly face the gate electrode G1, such that there is an insulation portion therebetween. The first gate electrode G1 may be the first storage electrode CE1 of the first capacitor CST1. The first transistor T1 may include a portion of the first insulation layer (discussed below) that is disposed between the first overlapping area of the active pattern and the first gate electrode G1.

The n-th scan line SLn may extend in a first direction DD1. The second transistor T2 may be defined in a second overlapping area of the active pattern ACT, which may overlap the n-th scan line SLn. The third transistor T3 may be defined in a third overlapping area of the active pattern ACT, which may overlap the n-th scan line SLn.

The first power voltage line PVL1 may be spaced apart from and adjacent to the n-th scan line SLn in a second direction DD2, and may extend in the first direction DD1. The first power voltage line PVL1 may include a first electrode portion CE2, a second electrode portion CE4 and a third electrode portion LE. Hereinafter, the first electrode portion CE2 may be referred to as the second storage electrode CE2, the second electrode portion CE4 may be referred to as the fourth storage electrode CE4, and the third electrode portion LE may be referred to as a line electrode LE.

The second storage electrode CE2 may be disposed in a center portion of the pixel to overlap the first gate electrode G1. The second storage electrode CE2 may include a hole H corresponding to a center portion of the first gate electrode G1. The fourth storage electrode CE4 may extend from the second storage electrode CE2 toward the n-th scan line SLn to overlap the n-th scan line SLn. In this way, the first power voltage line PVL1 may form each of the fourth storage electrode CE4 and the second storage electrode CE2. The line electrode LE may connect second storage electrodes CE2, which are disposed in adjacent pixels, to each other. The first storage capacitor CST1 may be defined by the first storage electrode CE1 that is the first gate electrode G1, and the second storage electrode CE2 included in the first power voltage line PVL1.

The first electrode pattern EP1 may overlap the fourth storage electrode CE4 included in the first power voltage line PVL1. The first electrode pattern EP1 may be connected to the first gate electrode G1 through the hole H of the second storage electrode CE2. The first electrode pattern EP1 may overlap or face the fourth storage electrode CE4. The first electrode pattern EP1 may be connected to the active pattern ACT where the third drain electrode D3 of the third transistor T3 is defined. The first electrode pattern EP1 may overlap or face the fourth storage electrode CE4 to define the third storage electrode CE3. The second storage capacitor CST2 may be defined by the third storage electrode CE3 included in the first electrode pattern EP1 and the fourth storage electrode CE4 included in the first power voltage line PVL1.

The (n−1)-th scan line SLn−1 may be spaced apart from the n-th scan line SLn in the second direction DD2, and may extend in the first direction DD1. The fourth transistor T4 may be defined in a fourth overlapping area of the active pattern ACT where the active pattern ACT overlaps the (n−1)-th scan line SLn−1. A seventh transistor T7 may be defined in a seventh overlapping area of the active pattern ACT where the active pattern ACT may overlap the (n−1)-th scan line SLn−1.

The initializing voltage line IVL may be spaced apart from the (n−1)-th scan line SLn−1 in the second direction DD2, and may extend in the first direction DD1.

The second electrode pattern EP2 may be connected to the initializing voltage line IVL and the active pattern ACT where the seventh drain electrode D7 of the seventh transistor T7 is defined.

The n-th light-emitting line ELn may be spaced apart from the n-th scan line SLn in the second direction DD2, and may extend in the first direction DD1. The fifth transistor T5 may be defined in a fifth overlapping area of the active pattern ACT where the active pattern ACT may overlap the n-th light-emitting line Eln. The sixth transistor T6 may be defined in a sixth overlapping area of the active pattern ACT where the active pattern ACT may overlap the n-th light-emitting line Eln.

The third electrode pattern EP3 may be connected to the active pattern ACT where the sixth drain electrode D6 of the sixth transistor T6 is defined.

The m-th data line DLm may extend in the second direction DD2, and may be connected to the active pattern ACT where the second source electrode S2 of the second transistor T2 is defined.

The second power voltage line PVL2 may extend in the second direction DD2, and may be connected to the first power voltage line PVL1. For example, the second power voltage line PVL2 may be connected to the second storage electrode CE2 included in the first power voltage line PVL1.

Figure 5:
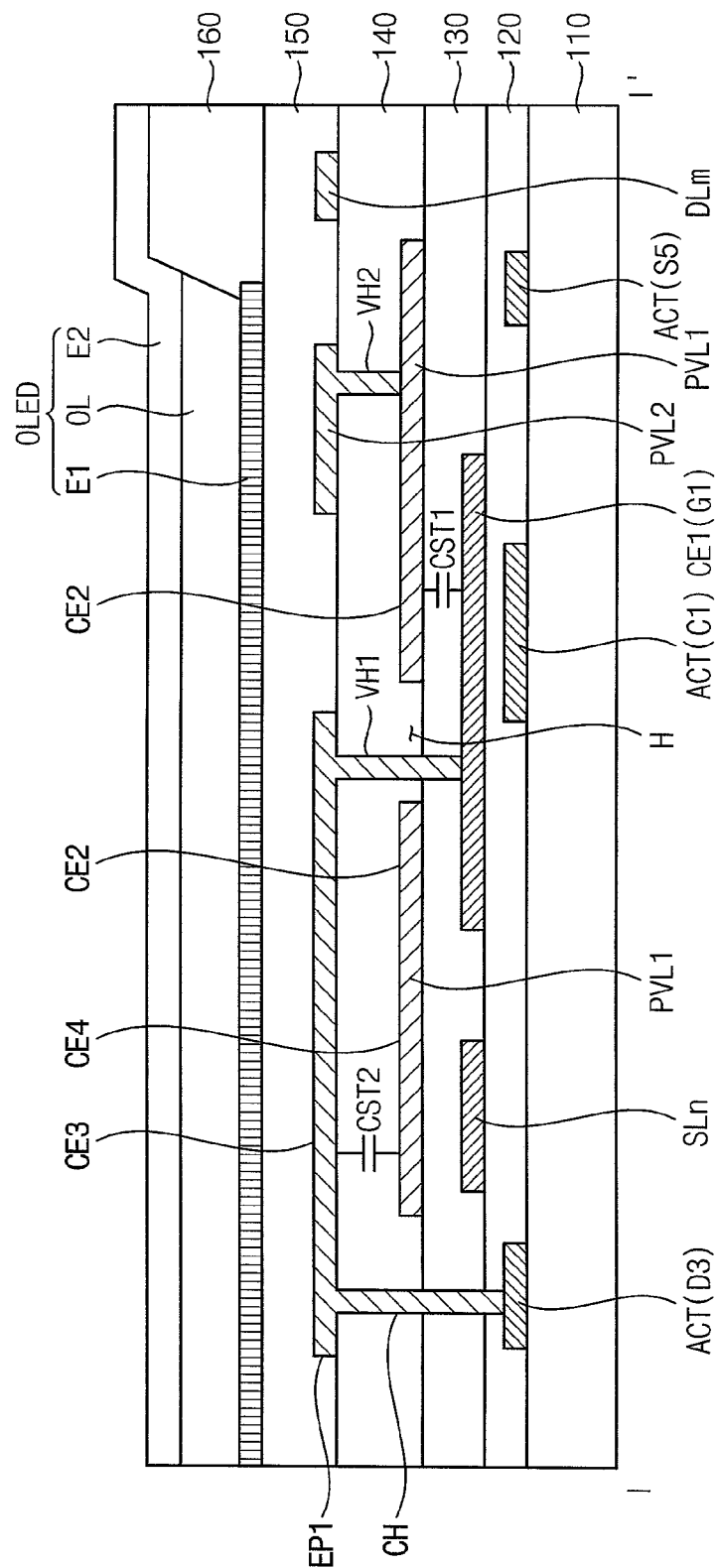
FIG. 5 is a schematic cross-sectional view of FIG. 4 taken along line I-I' of FIG. 4.

FIG. 5 is a schematic cross-sectional view of FIG. 4 taken along line I-I'. FIGS. 6 to 10 are plan views illustrating a method for manufacturing a display device according to an embodiment.

Figure 6:
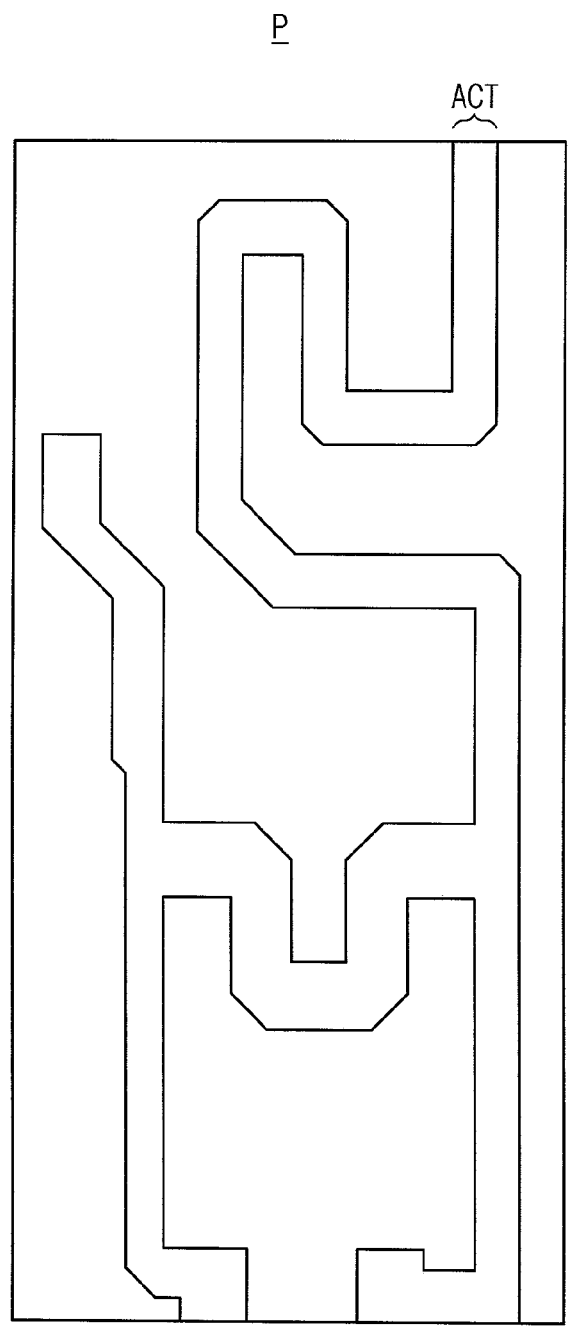
FIGS. 6 to 10 are plan views illustrating a method for manufacturing a display device according to an embodiment.

Referring to FIGS. 5 and 6, a substrate 110 may be an insulation substrate including glass, polymer, stainless steel or the like. In an embodiment, the substrate 110 may include a first plastic layer, a first barrier layer, a second plastic layer and a second barrier layer. For example, the first and second plastic layers may include a polymer such as polyimide (PI), polyethylene naphthalate (PEN), polyethylene terephthalate (PET), polyacrylate (PAR), polycarbonate (PC), polyetherimide (PEI), polyethersulfone (PS) or combination thereof. The first and second barrier layers may include amorphous silicon (a-Si), silicon oxide (SiOx), silicon nitride (SiNx) or combination thereof.

A semiconductor layer may be formed on the substrate 220, and may be patterned to form an active pattern ACT. The active pattern ACT may be formed as a single pattern in a pixel area where a pixel P is defined.

The active pattern (ACT) may include polysilicon or oxide semiconductor. The oxide semiconductor may include an oxide or a compound oxide of titanium (Ti), hafnium (Hf), zirconium (Zr), aluminum (Al), tantalum (Ta), germanium (Ge), zinc (Zn), gallium (Ga), tin (Sn) or indium (In). For example, the compound oxide may include In—Ga—Zn—O, Zn—In—O, Zn—Sn—O, In—Ga—O, In—Sn—O, In—Zr—O, In—Zr—Zn—O, In—Zr—Sn—O, In—Zr—Ga—O, In—Al—O, In—Zn—Al—O, In—Sn—Al—O, In—Al—Ga—O, In—Ta—O, In—Ta—Zn—O, In—Ta—Sn—O, In—Ta—Ga—O, In—Ge—O, In—Ge—Zn—O, In—Ge—Sn—O, In—Ge—Ga—O, Ti—In—Zn—O, Hf—In—Zn—O or a combination thereof.

Figure 7:
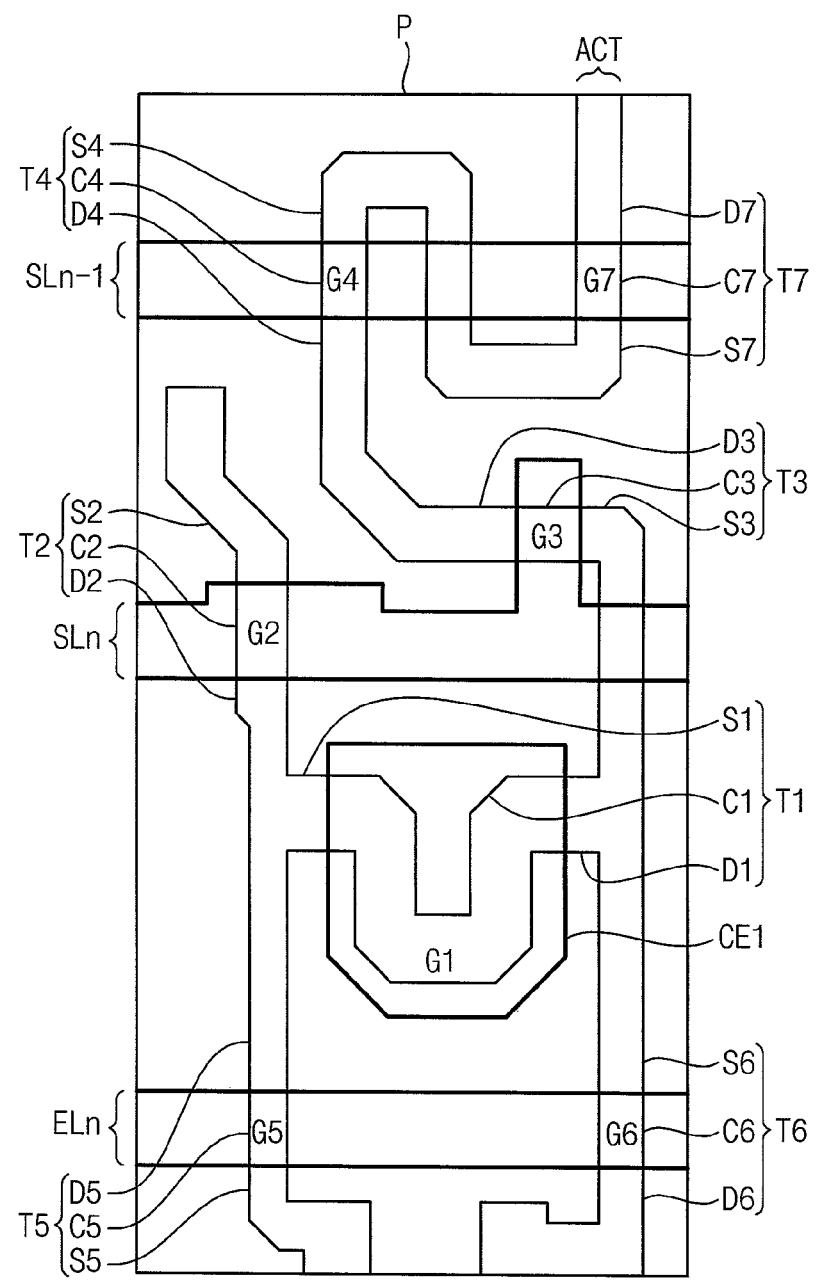
Figure 7:
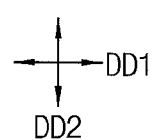

Referring to FIGS. 5 and 7, a first insulation layer 120 may be formed on the substrate 110 having the active pattern ACT. The first insulation layer 120 may be disposed on the substrate 110 to cover and be over the active pattern ACT. The first insulation layer 120 may be an inorganic insulation layer including silicon nitride, silicon oxide, silicon oxynitride or the like.

A first conductive layer may be formed on the first insulation layer 120 and may be patterned to form a first conductive pattern. The first conductive pattern may include a first gate electrode G1, an (n−1)-th scan line SLn−1, an n-th scan line SLn and an n-th light-emitting line ELn.

The substrate 110 having the first conductive pattern G1, SLn−1, SLn and ELn may be doped with impurities to form a channel, a source electrode and a drain electrode of a transistor. The channel may be doped with n-type impurities or p-type impurities. The source electrode and the drain electrode may be spaced apart from each other by the channel interposed therebetween, and may be doped with impurities of an opposite type to the impurities of the channel.

As illustrated in FIG. 7, a first channel C1 may be formed in the first overlapping area of the active pattern ACT, which may overlap the first gate electrode G1. The first source electrode Si and the first drain electrode D1 may be formed in areas of the active pattern ACT, which may be spaced apart from each other by the first channel C1 interposed therebetween. The first gate electrode G1 may be defined as the first storage electrode CE1 of the first storage capacitor CST1. The first gate electrode G1, the first source electrode S1 and the first drain electrode D1 may form a first transistor T1.

A second channel C2 may be formed in a second overlapping area of the active pattern ACT, which may overlap the n-th scan line SLn. The second source electrode S2 and the second drain electrode D2 may be formed in areas of the active pattern ACT, which may be spaced apart from each other by the second channel C2 interposed therebetween. The second gate electrode G2 may be defined by an area of the n-th scan line SLn overlapping the second channel C2. The second gate electrode G2, the second source electrode S2 and the second drain electrode D2 may form the second transistor T2.

A third channel C3 may be formed in the third overlapping area of the active pattern ACT, which may overlap the n-th scan line SLn. The third source electrode S3 and the third drain electrode D3 may be formed in areas of the active pattern ACT, which may be spaced apart from each other by the third channel C3 interposed therebetween. The third gate electrode G3 may be defined by an area of the n-th scan line SLn overlapping the third channel C3. The third gate electrode G3, the third source electrode S3 and the third drain electrode D3 may form the third transistor T3.

A fourth channel C4 may be formed in the fourth overlapping area of the active pattern ACT, which may overlap the (n−1)-th scan line SLn−1. The fourth source electrode S4 and the fourth drain electrode D4 may be formed in areas of the active pattern ACT, which may be spaced apart from each other by the fourth channel C4 interposed therebetween. The fourth gate electrode G4 may be defined by an area of the (n−1)-th scan line SLn−1 overlapping the fourth channel C4. The fourth gate electrode G4, the fourth source electrode S4 and the fourth drain electrode D4 may form the fourth transistor T4.

A seventh channel C7 may be formed in a seventh overlapping area of the active pattern ACT, which may overlap the (n−1)-th scan line SLn−1. The seventh source electrode S7 and the seventh drain electrode D7 may be formed in areas of the active pattern ACT, which may be spaced apart from each other by the seventh channel C7 interposed therebetween. The seventh gate electrode G7 may be defined by an area of the (n−1)-th scan line SLn−1 overlapping the seventh channel C7. The seventh gate electrode G7, the seventh source electrode S7 and the seventh drain electrode D7 may form the seventh transistor T7.

A fifth channel C5 may be formed in a fifth overlapping area of the active pattern ACT, which may overlap the n-th light-emitting line ELn. The fifth source electrode S5 and the fifth drain electrode D5 may be formed in areas of the active pattern ACT, which may be spaced apart from each other by the fifth channel C5 interposed therebetween. A fifth gate electrode G5 may be defined by an area of the n-th light-emitting line ELn overlapping the fifth channel C5. The fifth gate electrode G5, the fifth source electrode S5 and the fifth drain electrode D5 may form a fifth transistor T5.

A sixth channel C6 may be formed in a sixth overlapping area of the active pattern ACT, which may overlap the n-th light-emitting line ELn. The sixth source electrode S6 and the sixth drain electrode D6 may be formed in areas of the active pattern ACT, which may be spaced apart from each other by the sixth channel C6 interposed therebetween. The sixth gate electrode G6 may be defined by an area of the n-th light-emitting line ELn overlapping the sixth channel C6. The sixth gate electrode G6, the sixth source electrode S6 and the sixth drain electrode D6 may form the sixth transistor T6.

Figure 8:
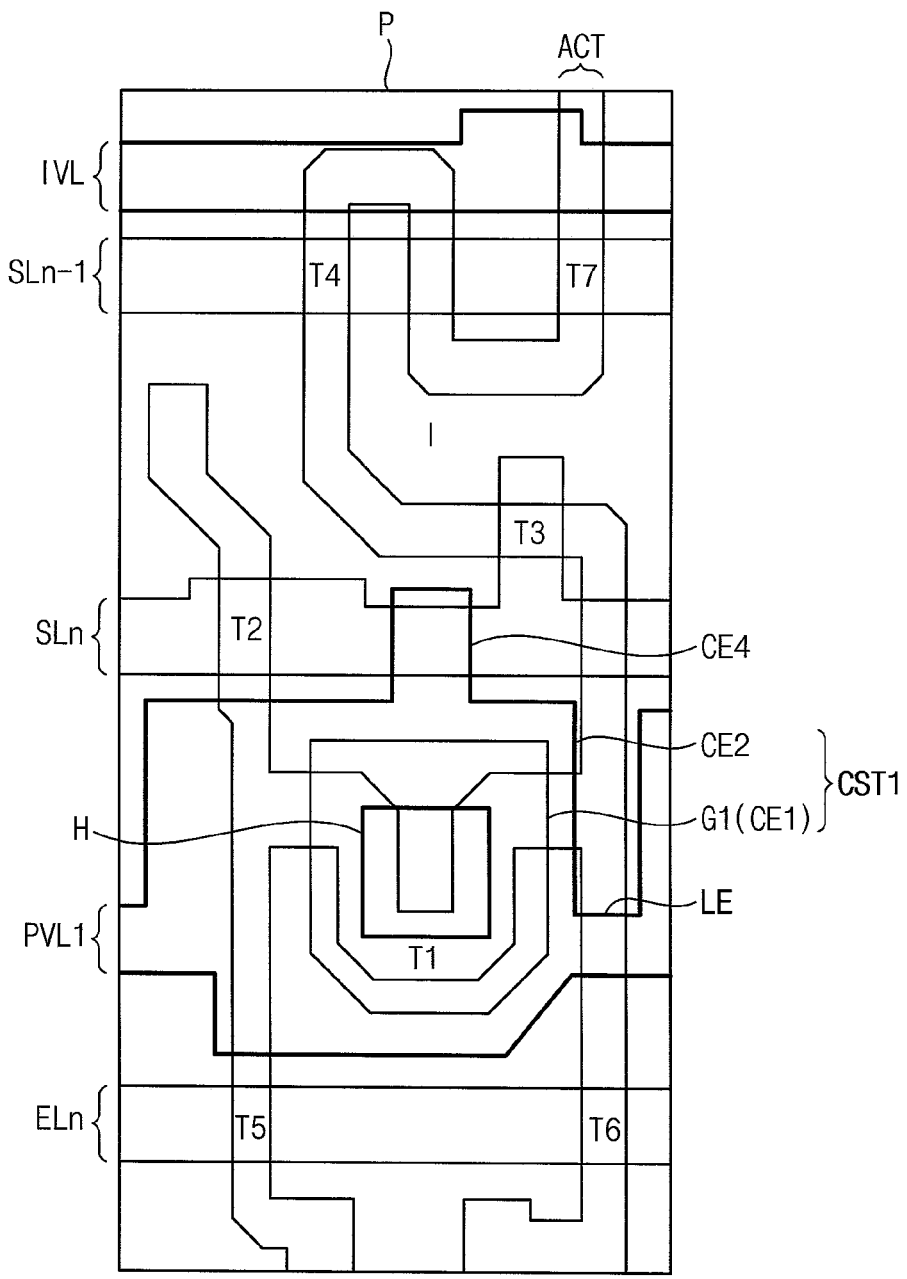
Figure 8:
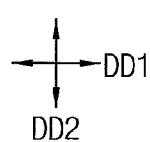

Referring to FIGS. 5 and 8, a second insulation layer 130 may be formed on the substrate 110 having the first conductive pattern G1, SLn−1, SLn and ELn. The second insulation layer 130 may cover and be over the first conductive pattern G1, SLn−1, SLn and ELn and may be disposed on the first insulation layer 120. The second insulation layer 130 may be an inorganic insulation layer including silicon nitride, silicon oxide, silicon oxynitride or the like.

A second conductive layer may be formed on the second insulation layer 130 and may be patterned to form a second conductive pattern.

The second conductive pattern may include an initializing voltage line IVL and a first power voltage line PVL1.

The initializing voltage line IVL may transfer an initializing voltage Vint. The initializing voltage line IVL may be spaced apart from the (n−1)-th scan line SLn−1 in the second direction DD2, and may extend in the first direction DD1.

The first power voltage line PVL1 may transfer a first light-emitting power voltage ELVDD. The first power voltage line PVL1 may be adjacent to the n-th scan line SLn in the second direction DD2, and may extend in the first direction DD1. The first power voltage line PVL1 may include a second storage electrode CE2, a fourth storage electrode CE4 and a line electrode LE, which may be defined in a single pattern.

The second storage electrode CE2 may overlap the first gate electrode G1, and may have a hole H overlapping a center portion of the first gate electrode G1. The fourth storage electrode CE4 may extend from the second storage electrode CE2 toward the n-th scan line SLn to overlap the n-th scan line SLn. The line electrode LE may connect the second storage electrodes CE2 formed in adjacent pixels to each other. The first storage capacitor CST1 may be formed by a first storage electrode CE1 that is the first gate electrode G1 and the second storage electrode CE2.

Figure 9:
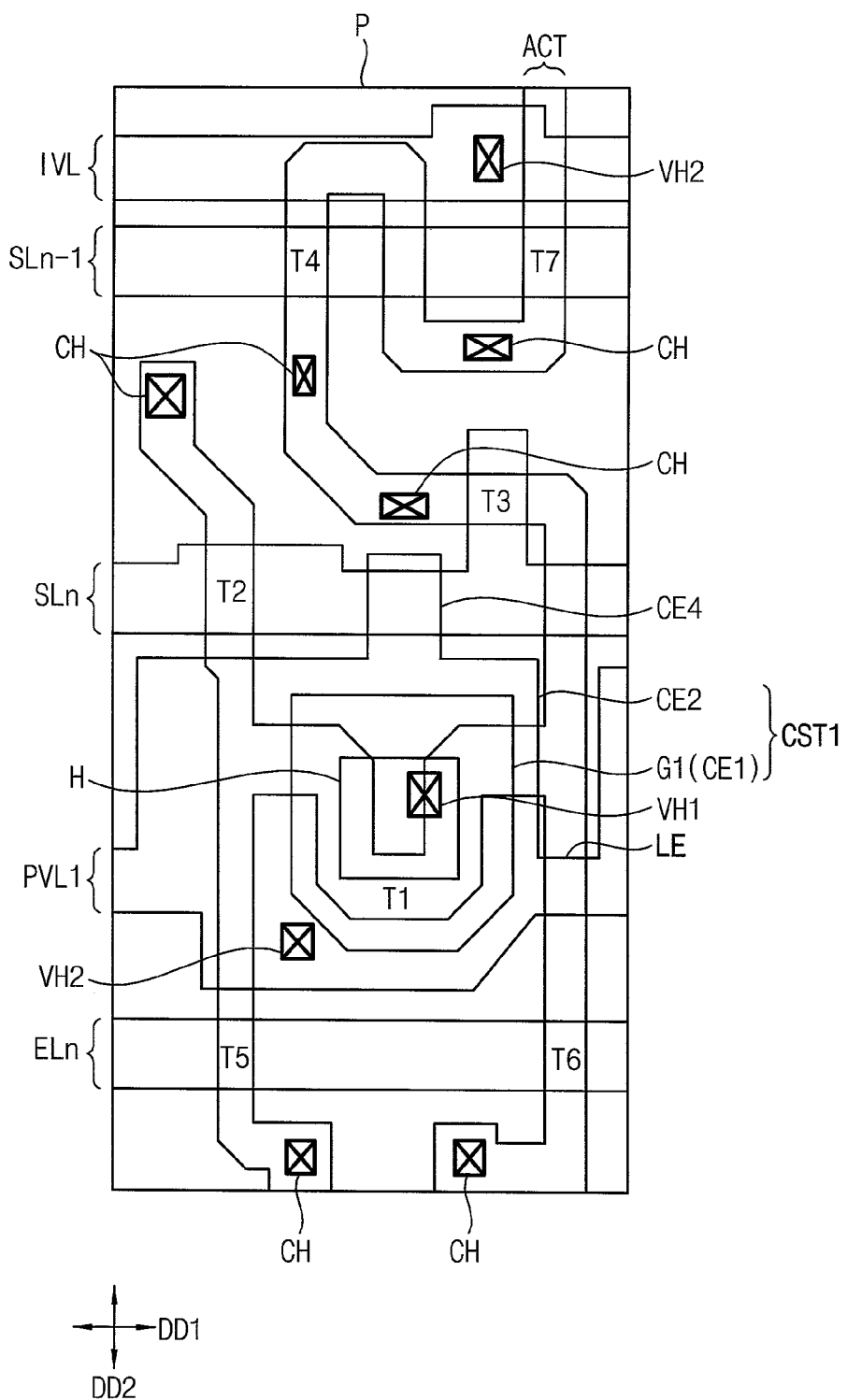

Referring to FIGS. 5 and 9, a third insulation layer 140 may be formed on the substrate 110 having the second conductive pattern IVL and PVL1. The insulation layer 140 may cover the second conductive pattern IVL and PVL1 and may be disposed on the second insulation layer 130. The third insulation layer 140 may include an inorganic insulation layer including silicon nitride, silicon oxide, silicon oxynitride or the like, an organic insulation layer including an acrylic resin, an epoxy resin, a polyimide resin, a polyester resin or the like, or combination thereof.

At least one insulation layer may be partially removed to form contact holes CH, via holes VH1 and second via holes VH2.

The contact holes CH may pass through the first insulation layer 120, the second insulation layer 130 and the third insulation layer 140 to expose the active pattern ACT.

The first via holes VH1 may pass through the second insulation layer 130 and the third insulation layer 140 to expose the first conductive pattern. For example, the first via holes VH1 may pass through the second insulation layer 130 and the third insulation layer 140 to expose the first gate electrode G1.

The second via holes VH2 may pass through the third insulation layer 140 to expose the second conductive pattern. For example, the second via holes VH2 may expose the first power voltage line PVL1 and a portion of the initializing voltage line IVL.

Figure 10:
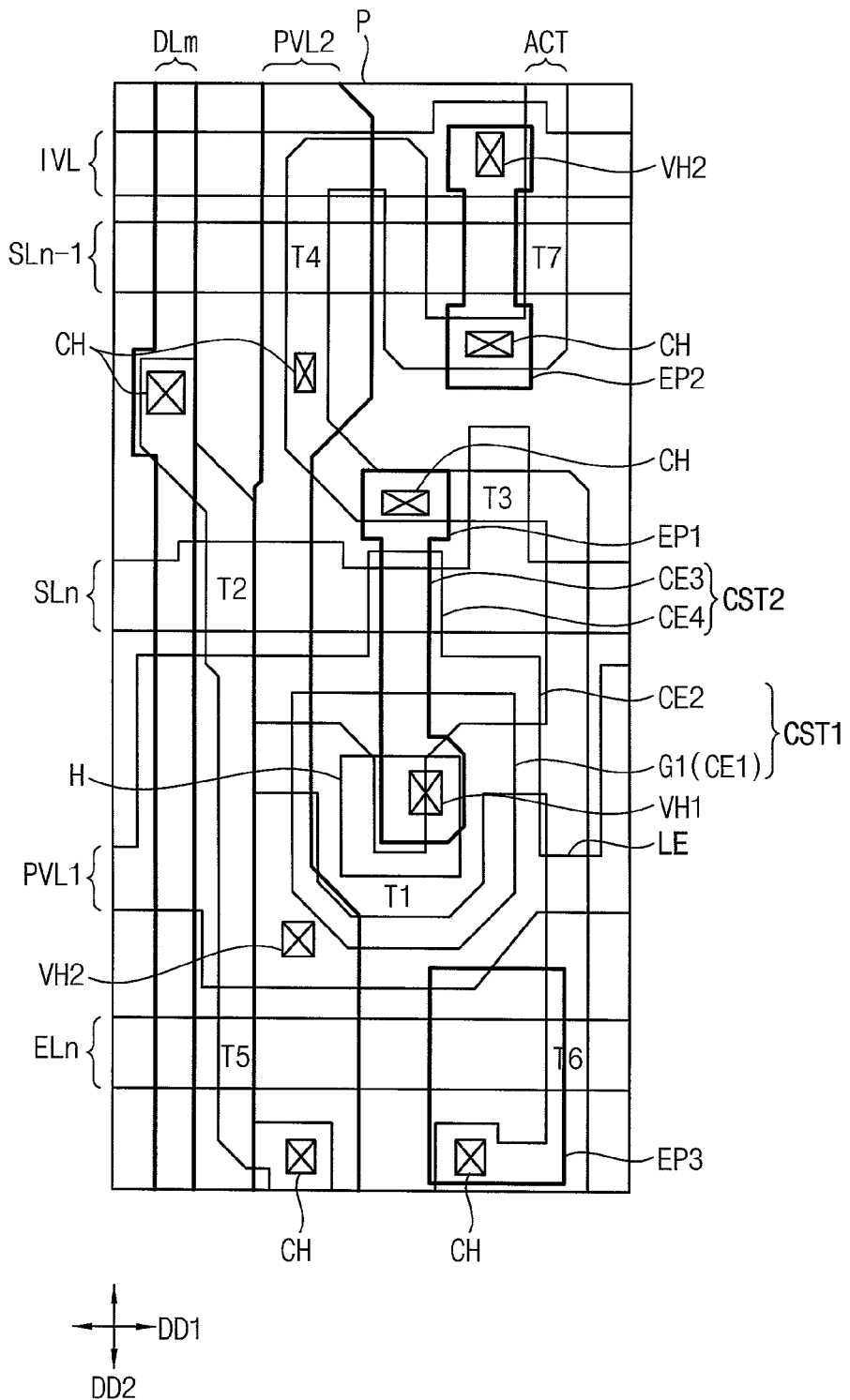

Referring to FIGS. 5 and 10, a third conductive layer may be formed on the substrate 110 having the contact holes CH, the first via holes VH1 and the second via holes VH2 and patterned to form a third conductive pattern.

The third conductive pattern may include an m-th data line DLm, a second power voltage line PVL2, a first electrode pattern EP1, a second electrode pattern EP2 and a third electrode pattern EP3.

The m-th data line DLm may extend in the second direction DD2, and may be connected to the active pattern ACT where a second source electrode SE of the second transistor T2 is defined.

The second power voltage line PVL2 may extend in the second direction DD2, and may be connected to the first power voltage line PVL1. For example, the second power voltage line PVL2 may be connected to the second storage electrode CE2 of the first power voltage line PVL1.

The first electrode pattern EP1 may overlap or face the fourth storage electrode CE4 included in the first power voltage line PVL1. The first electrode pattern EP1 may be connected to the first gate electrode G1 through the hole H of the second storage electrode CE2. The first electrode pattern EP1 may overlap or face the fourth storage electrode CE4 overlapping the n-th scan line SLn. The first electrode pattern EP1 may be connected to the active pattern ACT where the third drain electrode D2 of the third transistor T3 is defined. A third storage electrode CE3 may be defined in an area where the first electrode pattern CE3 may overlap the fourth storage electrode CE4. As the fourth storage electrode CE4 included in the first power voltage line PVL1 is disposed between the n-th scan line SLn and the first electrode pattern EP1, a parasitic capacitance between the n-th scan line SLn and the third drain electrode D3 of the third transistor T3, which is connected to the first electrode pattern EP1, may be prevented.

The second storage capacitor CST2 may be formed by the third storage electrode CE3 and the fourth storage electrode CE4.

The second electrode pattern EP2 may be connected to the initializing voltage line IVL and the active pattern ACT where the seventh drain electrode D7 of the seventh transistor T7 is defined.

The third electrode pattern EP3 may be connected to the active pattern ACT where the sixth drain electrode D6 of the sixth transistor T6.

A fourth insulation layer 150 may be formed on the substrate 110 having the third conductive pattern DLm, PVL2, EP1, EP2 and EP3. The fourth insulation layer 150 may be provided as a flat surface on the third conductive pattern DLm, PVL2, EP1, EP2 and EP3. The fourth insulation layer 150 may include an organic insulation layer, which may include an acrylic resin, an epoxy resin, a polyimide resin, a polyester resin or the like, and/or an inorganic insulation layer, which includes silicon nitride, silicon oxide, silicon oxynitride or the like, or a combination thereof.

A pixel electrode E1 may be formed on the fourth insulation layer 150. The pixel electrode E1 may be formed in each of pixels. The pixel electrode E1 may be connected to the drain electrode D6 of the sixth transistor T6 through a contact hole CH formed through the fourth insulation layer 150. The pixel electrode E1 may include a metal, a transparent conductive oxide or the like.

A fifth insulation layer 160 may be disposed on the pixel electrode E1. The fifth insulation layer 160 may cover and be over an edge of the pixel electrode E1, and may be disposed on the fourth insulation layer 150. The fifth insulation layer 160 may have an opening a portion of the pixel electrode E1. The opening may define a light-emitting area of the pixel. The fifth insulation layer 160 may include an organic insulation material such as an acrylic resin, an epoxy resin, a polyimide resin, a polyester resin or the like.

An organic light-emitting layer OL may be disposed on the pixel electrode E1. The organic light-emitting layer OL may be disposed with a hole injection layer (HIL) and/or a hole transport layer (HTL). The hole transport layer may have a high transport ability for holes and inhibit movement of electrons, which are not combined with holes in the organic light-emitting layer OL so that a recombination opportunity of electrons and holes may be prevented.

An opposing electrode E2 may be disposed to cover and be over an entire area of the substrate 110 having the organic light-emitting layer OL. The opposing electrode E2 may include a metal, a transparent conductive oxide or the like. The pixel electrode E1, the organic light-emitting layer OL and the opposing electrode E2 may form an organic light-emitting diode OLED.

Figure 11A:
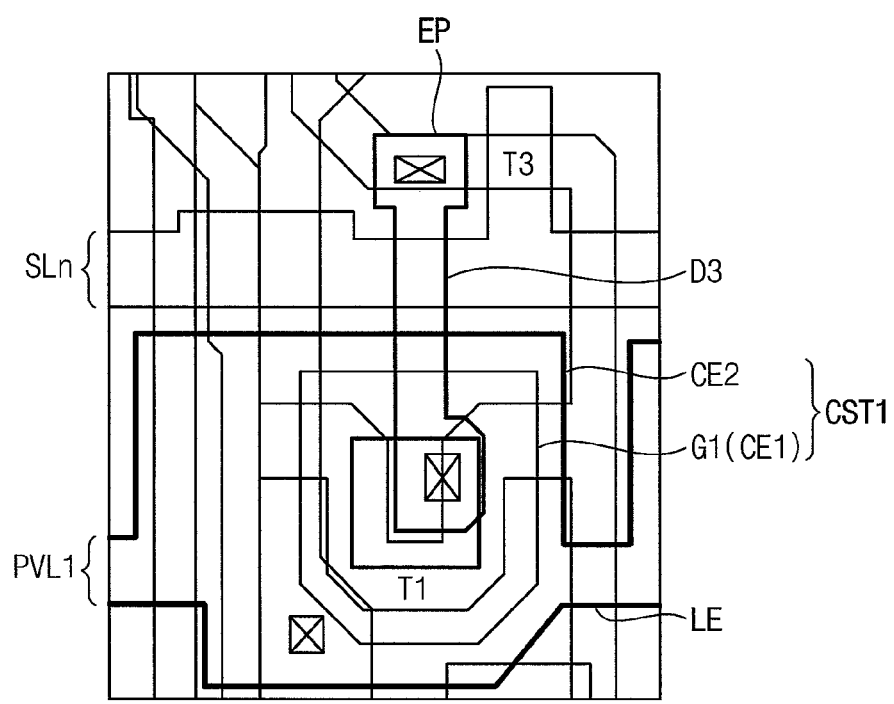
FIGS. 11A and 11B illustrate a plan view and schematic diagram of an equivalent circuit of a pixel, respectively, according to a comparative example.
Figure 11B:
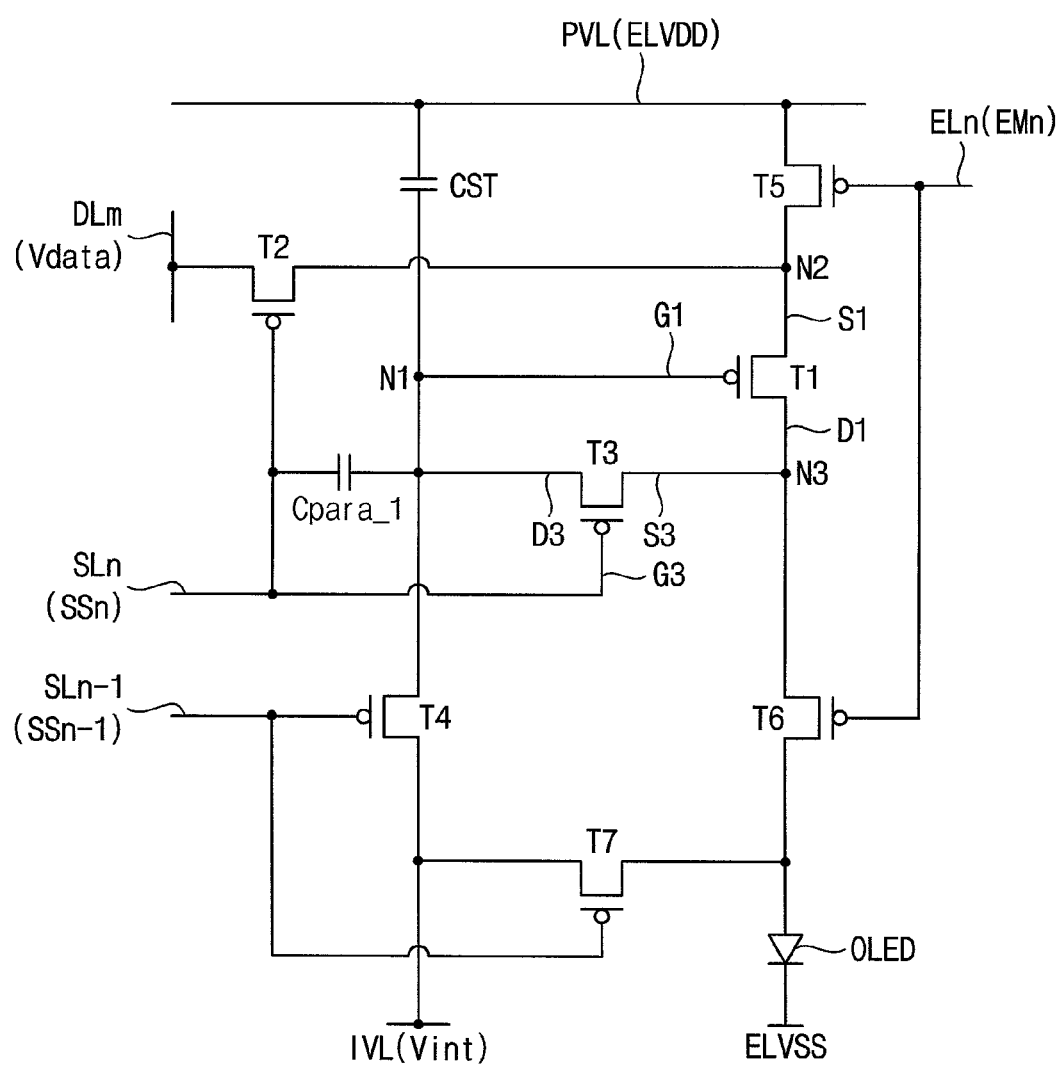
Figure 12:
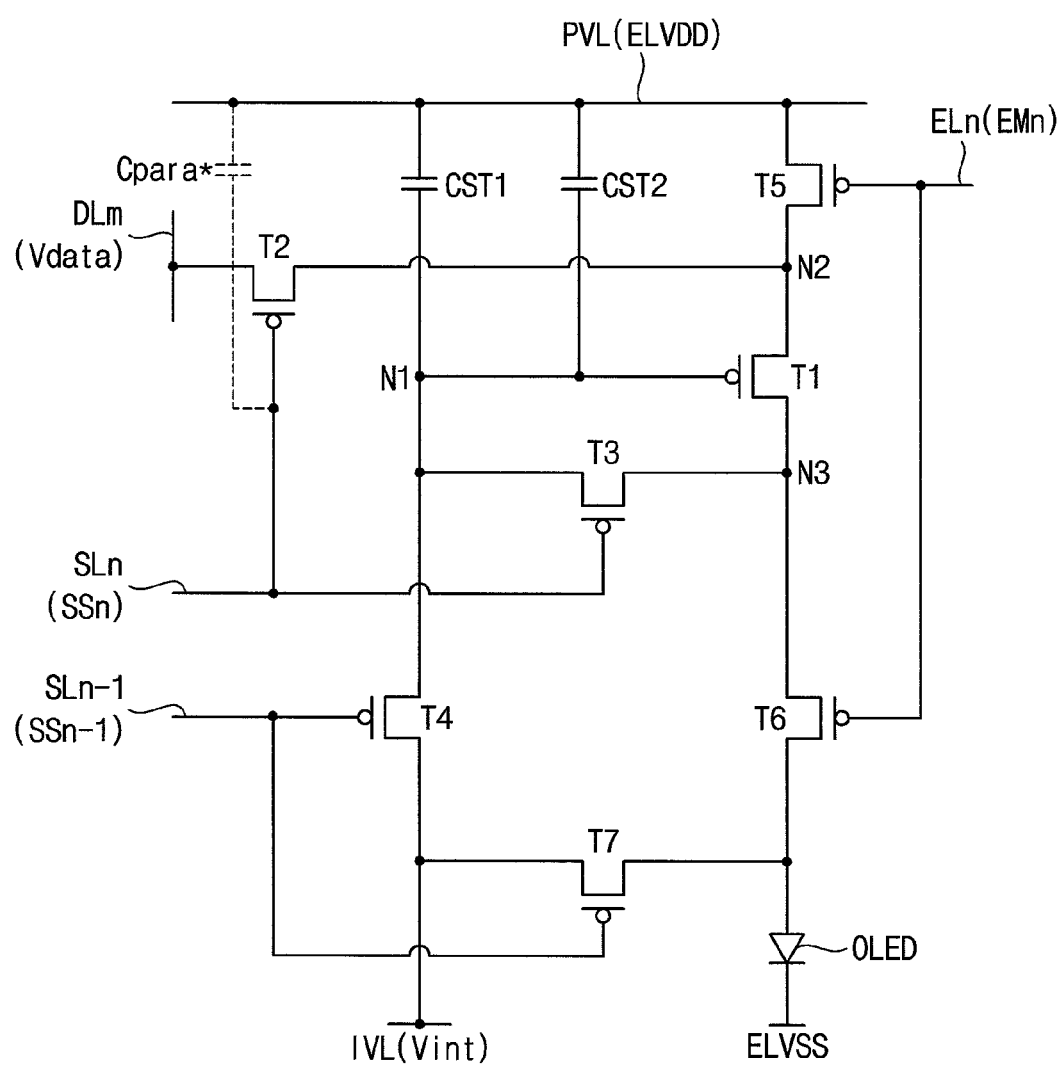
FIG. 12 is a schematic diagram of an equivalent circuit of a pixel, according to an embodiment, for comparison with the comparative example of FIG. 11B.

FIGS. 11A and 11B illustrates a schematic diagram of an equivalent circuit of a pixel according to a comparative example. FIG. 12 is a schematic diagram of an equivalent circuit of a pixel according to an embodiment for comparison with the comparative example.

Referring to FIGS. 11A and 11B, a pixel according to a comparative example includes a first transistor T1, a first power voltage line PVL1, a storage capacitor CST and a third transistor T3.

The first transistor T1 may include a first gate electrode G1. The first gate electrode G1 may define a first storage electrode CE1 of the storage capacitor CST.

The first power voltage line PVL1 may include a second storage electrode CE2 overlapping the first gate electrode G1, which is the first storage electrode CE1, and a line electrode LE. The line electrode may connect adjacent second storage electrodes formed in adjacent pixels to each other.

The storage capacitor CST may be defined by the first storage electrode CE1, which is the first gate electrode G1, and the second storage electrode CE2 of the first power voltage line PVL1.

The third transistor T3 may include a third drain electrode D3, which may be formed as a first electrode pattern EP1. The first electrode pattern EP1 may be connected to the first gate electrode G1 and may overlap an n-th scan line SLn.

The n-th scan line SLn may be formed as a first conductive pattern. The first electrode pattern EP1 including the third drain electrode D3 may be formed as a third conductive pattern.

Thus, as illustrated in FIG. 11B, a parasitic capacitor Cpara_1 may be formed in an area where the n-th scan line SLn and the third drain electrode D3 may overlap each other.

The parasitic capacitor Cpara_1 may increase a kickback voltage Vkickback_1 of the third transistor T3, which is generated when an n-th scan signal applied to the n-th scan line SLn is changed into a turn-off voltage from a turn-on voltage.

The kickback voltage Vkickback_1 of the third transistor T in the comparative example may be defined by the following Equation 2.

$$\text{Vkickback\_1} = \frac{\text{Cpara\_1}}{CST + \text{Cpara\_1}} \times \Delta Vg \qquad \text{[Equation 2]}$$

According to Equation 2, the parasitic capacitor Cpara_1 may increase the kickback voltage Vkickback_1 of the third transistor T3. A variance of the kickback voltage Vkickback_1 may be increased due to deterioration of the third transistor T3. The variance of the kickback voltage Vkickback_1 of the third transistor T3 may cause a decrease in brightness and low brightness smudge.

Referring to FIGS. 4, 5 and 12, a pixel according to an embodiment may include the first transistor T1, the first storage capacitor CST1, the first power voltage line PVL1, the third transistor T3 and the second storage capacitor CST2.

The first transistor T1 may include the first gate electrode G1. The first gate electrode G1 may define a first storage electrode CE1 of the first storage capacitor CST1.

The first power voltage line PVL1 may include the second storage electrode CE2, the fourth storage electrode CE4 and a line electrode LE, which are formed in a single pattern. The second storage electrode CE2 may be disposed in a center portion of the pixel to overlap or face the first gate electrode G1. The fourth storage electrode CE4 may extend toward to an n-th scan line SLn from the second storage electrode CE2 to overlap or face the n-th scan line SLn. The line electrode LE may connect the second storage electrodes CE2 disposed in adjacent pixels to each other.

The first storage capacitor CST1 may be defined in an area where the first gate electrode G1 and the second storage electrode CE2 overlap and face each other.

The third transistor T3 may include the third drain electrode D3, which may be formed as the first electrode pattern EP1. The first electrode pattern EP1 may be connected to the first gate electrode G1, and may overlap or face the fourth storage electrode CE4 overlapping the n-th scan line SLn. A third storage electrode CE3 may be defined in an area where the first electrode pattern EP1 may overlap or face the fourth storage electrode CE4.

The second storage capacitor CST2 may be defined in an area where the first electrode pattern EP1 and the fourth storage electrode CE4 may overlap or face each other.

A parasitic capacitor Cpara* may be formed in an area where the n-th scan line SLn may overlap or face the fourth storage electrode CE4 that is formed by a portion of the first power voltage line PVL1.

In an embodiment, the fourth storage electrode CE4 extending from the second storage electrode CE2 formed as a second conductive pattern may overlap the n-th scan line SLn formed as a first conductive pattern and the third drain electrode D3 formed as a third conductive pattern. As a result, the parasitic capacitor Cpara_1 of the comparative example may be replaced, in an embodiment of the disclosure, by each of the second storage capacitor CST2 connected to the first storage capacitor CST1 in parallel, and the parasitic capacitor Cpara*connected to the first power voltage line PVL1.

Thus, the kickback voltage Vkickback of the third transistor T3 may be decreased by virtue of an increase in capacitances of the first and second storage capacitors CST1 and CST2.

According to an embodiment, the parasitic capacitor Cpara* may be removed from the first gate electrode G1 of the first transistor T1. Thus, a driving reliability of the first transistor T1 and the third transistor T3 may be improved.

According to an embodiment, the fourth storage electrode CE4 of the first power voltage line PVL1 formed as the second conductive pattern may shield the n-th scan line SLn formed as the first conductive pattern from the third drain electrode D3 formed as the third conductive pattern. Thus, a parasitic capacitor therebetween is unnecessary.

According to an embodiment, an electrode of a second conductive pattern, which receives a power voltage, may be disposed between a scan line, which is a first conductive pattern, and a drain electrode of a third transistor, which is a third conductive pattern. Thus, a parasitic capacitor therebetween is unnecessary, and a storage capacitance may be increased. Thus, a kickback voltage of the third transistor may be decreased, thereby preventing image defects such as a decrease in brightness and low brightness smudge.

An organic light-emitting display device according to embodiments may be used for a display device, which may be included in a personal computer, a notebook computer, a mobile phone, a smart phone, a PMP, a PDA, an MP3 player or the like.

The foregoing is illustrative of embodiments herein and is not to be construed as limiting thereof. Although one or more embodiments have been described, those skilled in the art will readily appreciate that many modifications are possible without materially departing from the novel teachings and aspects of the disclosure. Accordingly, all such modifications are intended to be included within the scope of the disclosure. Therefore, it is to be understood that the foregoing is illustrative of various embodiments and is not to be construed as limited to the specific embodiments disclosed, and that modifications to the disclosed embodiments, as well as other embodiments, are intended to be included within the scope of the disclosure, as set forth in the following claims and equivalents thereof.

What is claimed is:

1. A display device comprising:
an active pattern disposed on a substrate;
a first transistor including a first gate electrode disposed in a first overlapping area of the active pattern where the first gate electrode overlaps the active pattern in plan view;
a first scan line disposed adjacent to the first gate electrode;
a first power voltage line including a first electrode portion and a second electrode portion, the first electrode portion overlapping the first gate electrode in plan view, the second electrode portion extending from the first electrode portion in a direction crossing the first scan line and overlapping the first scan line in plan view at an overlap area;
a first electrode pattern connected to the first gate electrode and overlapping the overlap area in plan view; and
an organic light-emitting layer disposed on the substrate.

2. The display device of claim 1, further comprising:
a first insulation layer disposed on the active pattern;
a second insulation layer disposed on the first gate electrode;
a third insulation layer disposed on the first power voltage line; and
a fourth insulation layer disposed on the first electrode pattern,
wherein the first gate electrode is disposed on the first insulation layer, the first power voltage line is disposed on the second insulation layer, and the first electrode pattern is disposed on the third insulation layer.

3. The display device of claim 1, further comprising:
a second transistor including a second gate electrode disposed in a second overlapping area of the active pattern where the first scan line overlaps the active pattern; and
a third transistor including a third gate electrode disposed in a third overlapping area of the active pattern where the first scan line overlaps the active pattern,
wherein the first electrode pattern is connected to a third drain electrode of the third transistor.

4. The display device of claim 1, further comprising:
a data line crossing the first scan line; and
a second power voltage line crossing the first power voltage line and being connected to the first power voltage line.

5. The display device of claim 1, further comprising:
a second scan line disposed parallel to the first scan line;
a fourth transistor including a fourth gate electrode disposed in a fourth overlapping area of the active pattern where the second scan line overlaps the active pattern; and
a seventh transistor including a seventh gate electrode disposed in a seventh overlapping area of the active pattern where the second scan line overlaps the active pattern.

6. The display device of claim 5, further comprising:
an initializing voltage line disposed parallel to the first scan line; and
a second electrode pattern connecting the initializing voltage line to a seventh drain electrode of the seventh transistor.

7. The display device of claim 1, further comprising:
a light-emitting line disposed parallel to the first scan line;
a fifth transistor including a fifth gate electrode disposed in a fifth overlapping area of the active pattern where the light-emitting line overlaps the active pattern; and
a sixth transistor including a sixth gate electrode disposed in a sixth overlapping area of the active pattern where the light-emitting line overlaps the active pattern.

8. The display device of claim 7, further comprising a third electrode pattern connected to a sixth drain electrode of the sixth transistor.

9. A display device comprising:
a first transistor;
a second transistor connected to a first scan line, a data line crossing the first scan line and a source electrode of the first transistor;
a power voltage line transferring a first power voltage;
a first storage capacitor connected to the power voltage line and a gate electrode of the first transistor;
a second storage capacitor connected to the power voltage line and the gate electrode of the first transistor;
a third transistor connected to the first scan line, the gate electrode of the first transistor and a drain electrode of the first transistor; and
an organic light-emitting diode receiving a second power voltage and generating a light in response to operation of the first transistor.

10. The display device of claim 9, further comprising;
a fifth transistor connected to a light-emitting line, the power voltage line and the source electrode of the first transistor; and
a sixth transistor connected to the light-emitting line, a drain electrode of the first transistor and the organic light-emitting diode.

11. The display device of claim 10, further comprising:
a fourth transistor connected to a second scan line, the gate electrode of the first transistor and an initializing voltage line receiving an initializing voltage; and
a seventh transistor connected to the second scan line, the initializing voltage line and the organic light-emitting diode.

12. The display device of claim 11, wherein the first scan line receives an n-th scan signal, and the second scan line receives an (n−1)-th scan signal, wherein n is a natural number.

13. The display device of claim 9, further comprising a capacitor connected to the power voltage line and the gate electrode of the second transistor.

* * * * *